US 7,265,531 B2

(12) United States Patent
Stauth et al.

(10) Patent No.: US 7,265,531 B2
(45) Date of Patent: *Sep. 4, 2007

(54) INTEGRATED CURRENT SENSOR (75) Inventors: Jason Stauth, Concord, NH (US); Richard Dickinson, Concord, NH (US); John Sauber, Millbury, MA (US); Ray Engel, Southbridge, MA (US); Sandra Pinelle, Nashua, NH (US)

(73) Assignee: Allegro MicroSystems, Inc., Worcester, MA (US)

( * ) Notice: Subject to any disclaimer, the term of this patent is extended or adjusted under 35 U.S.C. 154(b) by 49 days.

This patent is subject to a terminal disclaimer.

(21) Appl. No.: 10/831,906

(22) Filed: Apr. 26, 2004

(65) Prior Publication Data
US 2004/0196024 A1  Oct. 7, 2004

Related U.S. Application Data (63) Continuation of application No. 10/251,007, filed on Sep. 20, 2002, now Pat. No. 6,781,359.

(51) Int. Cl.
  *G01R 15/20*  (2006.01)
  *G01R 33/07*  (2006.01)
(52) U.S. Cl. .................................. 324/117 H; 324/126
(58) Field of Classification Search ............... None
  See application file for complete search history.

(56) References Cited

U.S. PATENT DOCUMENTS

| 3,226,640 | A | | 12/1965 | Kuhrt et al. ............ 324/117 H |
| 4,893,073 | A | | 1/1990 | McDonald et al. ..... 324/117 H |
| 4,939,449 | A | | 7/1990 | Cattaneo et al. ....... 324/117 R |
| 5,583,429 | A | * | 12/1996 | Otaka ....................... 324/127 |
| 5,587,651 | A | * | 12/1996 | Berkcan et al. ............. 324/127 |
| 5,831,425 | A | * | 11/1998 | Ochiai .................... 324/117 R |
| 6,005,383 | A | * | 12/1999 | Savary et al. ........... 324/117 H |
| 6,252,389 | B1 | | 6/2001 | Baba et al. ............. 324/117 H |
| 6,417,661 | B1 | * | 7/2002 | Berkcan et al. ......... 324/117 R |
| 6,424,018 | B1 | | 7/2002 | Ohtsuka ..................... 257/421 |
| 6,426,617 | B1 | * | 7/2002 | Haensgen et al. ...... 324/117 H |
| 6,515,468 | B1 | | 2/2003 | Morimoto et al. ...... 324/117 H |
| 6,548,998 | B1 | | 4/2003 | Gudel .................... 324/117 H |
| 6,686,730 | B2 | * | 2/2004 | Marasch et al. ........ 324/117 R |
| 6,759,840 | B2 | * | 7/2004 | Marasch et al. ........ 324/117 H |

(Continued)

FOREIGN PATENT DOCUMENTS

DE  10022316  11/2001

(Continued)

OTHER PUBLICATIONS

PCT Search Report; PCT/US02/24008 dated Dec. 4, 2003.

(Continued)

*Primary Examiner*—Ernest Karlsen
(74) *Attorney, Agent, or Firm*—Daly, Crowley, Mofford & Durkee, LLP (57) ABSTRACT

An integrated current sensor includes a magnetic field transducer such as a Hall effect sensor, a magnetic core, and an electrical conductor. The conductor includes features for receiving portions of the Hall effect sensor and the core and the elements are dimensioned such that little or no relative movement among the elements is possible.

6 Claims, 9 Drawing Sheets

U.S. PATENT DOCUMENTS

| | | | |
|---|---|---|---|
| 6,781,359 B2 * | 8/2004 | Stauth et al. | 324/117 H |
| 6,819,095 B1 * | 11/2004 | Dubhashi et al. | 324/117 H |

FOREIGN PATENT DOCUMENTS

| | | | |
|---|---|---|---|
| EP | 0867725 | | 9/1998 |
| EP | 1107327 | | 6/2001 |
| EP | 1107328 | | 6/2001 |
| EP | 1111693 | | 6/2001 |
| EP | 1180804 | | 2/2002 |
| JP | 61-71649 | * | 4/1986 |
| JP | 01066563 | | 3/1989 |
| JP | 1240867 | | 9/1989 |
| JP | 4-364472 | * | 12/1992 |
| JP | 4364472 | | 12/1992 |
| JP | 6130087 | | 5/1994 |
| JP | 6171649 | | 8/1994 |
| JP | 08178965 | | 12/1994 |
| JP | 8015330 | | 1/1996 |
| JP | 8178965 | | 7/1996 |
| JP | 8241821 | | 9/1996 |
| JP | 2000174357 | | 6/2000 |
| JP | 2001165963 | | 6/2001 |
| JP | 2001174486 | | 6/2001 |
| JP | 2001221815 | | 8/2001 |
| JP | 2001230467 | | 8/2001 |
| JP | 3230580 | | 11/2001 |
| JP | 2002202326 | | 7/2002 |
| JP | 2002202327 | | 7/2002 |

OTHER PUBLICATIONS

: Japanese Provisional Publication of Patent No. 2001-339109; Published Dec. 7, 2001; Entitled: "Current Detection Device Equipped wit Hall Device:" Applicant Sanken Electric Co., Ltd.

: Japanese Provisional Publication of Patent 2002-40058; Published Feb. 6 , 2002 ; Entitled: "Current Detection Device Equipped with Hall Device:" Applicant Sanken Electric Co., Ltd.

* cited by examiner

INTEGRATED CURRENT SENSOR

CROSS REFERENCE TO RELATED APPLICATIONS

This application is a continuation of U.S. patent application Ser. No. 10/251,007 entitled "INTEGRATED CURRENT SENSOR," filed on Sep. 20, 2002, now U.S. Pat. No. 6,781,359.

STATEMENT REGARDING FEDERALLY SPONSORED RESEARCH

Not Applicable.

FIELD OF THE INVENTION

This invention relates generally to electrical current sensors, and more particularly to a miniaturized current sensor having an integrated conductor.

BACKGROUND OF THE INVENTION

As is known in the art, one type of conventional electrical current sensor uses a Hall effect magnetic field transducer in proximity to a current-carrying conductor. The Hall effect device generates an output signal having a magnitude proportional to the magnetic field induced by the current through the conductor. Typical current sensors of this type include a gapped toroid magnetic flux concentrator, with the Hall effect device positioned in the toroid gap. The Hall effect device and toroid are assembled in a housing which is mountable on a printed circuit board. In use, a separate current-carrying conductor, such as a wire, is passed through the center of the toroid and is soldered to the printed circuit board, such as by soldering exposed ends of the wire to plated through-holes. Such devices tend to be undesirably large, both in terms of height and circuit board area.

Various parameters characterize the performance of Hall effect devices in current sensing applications, including sensitivity, which is the change in the output signal of the Hall effect device in response to a one ampere change through the conductor, and linearity, which is the degree to which the output signal varies in direct proportion to the current through the conductor. Important considerations in the use of Hall effect devices include the effect of stray magnetic fields and external magnetic noise on the device performance.

SUMMARY OF THE INVENTION

In accordance with the present invention, an integrated current sensor is provided with a conductor having a first notch substantially aligned with a second notch, a magnetic field transducer having at least a portion positioned in the first notch, and a magnetic core. The magnetic core is substantially C-shaped, with a central region and a pair of substantially parallel legs extending from the central region. At least a portion of the central region of the magnetic core is positioned in the second notch such that each leg covers at least a portion of a respective surface of the magnetic field transducer. In the illustrated embodiments, the magnetic field transducer is a Hall effect sensor containing a Hall effect element.

With this arrangement, the Hall effect sensor, the conductor, and the magnetic core are essentially locked in place relative to each other by the first and second notches and also by dimensional characteristics of the elements. As a result of the precise mechanical positioning of the elements, the sensitivity of the current sensor is highly repeatable and thus, tightly controlled.

The magnetic core provides a sensitivity that is higher than otherwise possible and also provides a magnetic field across the Hall effect element that is substantially uniform.

In one embodiment, each of the legs of the magnetic core covers substantially an entire surface of the Hall effect sensor. This arrangement, in combination with the C-shape of the magnetic core, serves to reduce susceptibility to stray magnetic fields and external magnetic noise, to increase sensitivity and to improve the uniformity of the magnetic field across the Hall effect element.

At least a portion of the Hall effect sensor, conductor, and magnetic core are encapsulated with an electrically insulating material. The conductor is provided with a mechanism for mounting the current sensor to a printed circuit board, such as through-holes adapted to receive hardware, leads or tabs for inserting into printed circuit board through-holes or for surface mount soldering to pads. The resulting integrated current sensor provides a significantly smaller, single component alternative to the conventional gapped toroid design.

To achieve further integration, the Hall effect sensor contains circuitry for processing the output signal of the Hall effect element, including one or more signal amplifiers. Preferably, the circuitry also includes additional elements, such as digital-to-analog converters and counters, which can be controlled in order to trim performance parameters, such as sensitivity and quiescent offset voltage.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
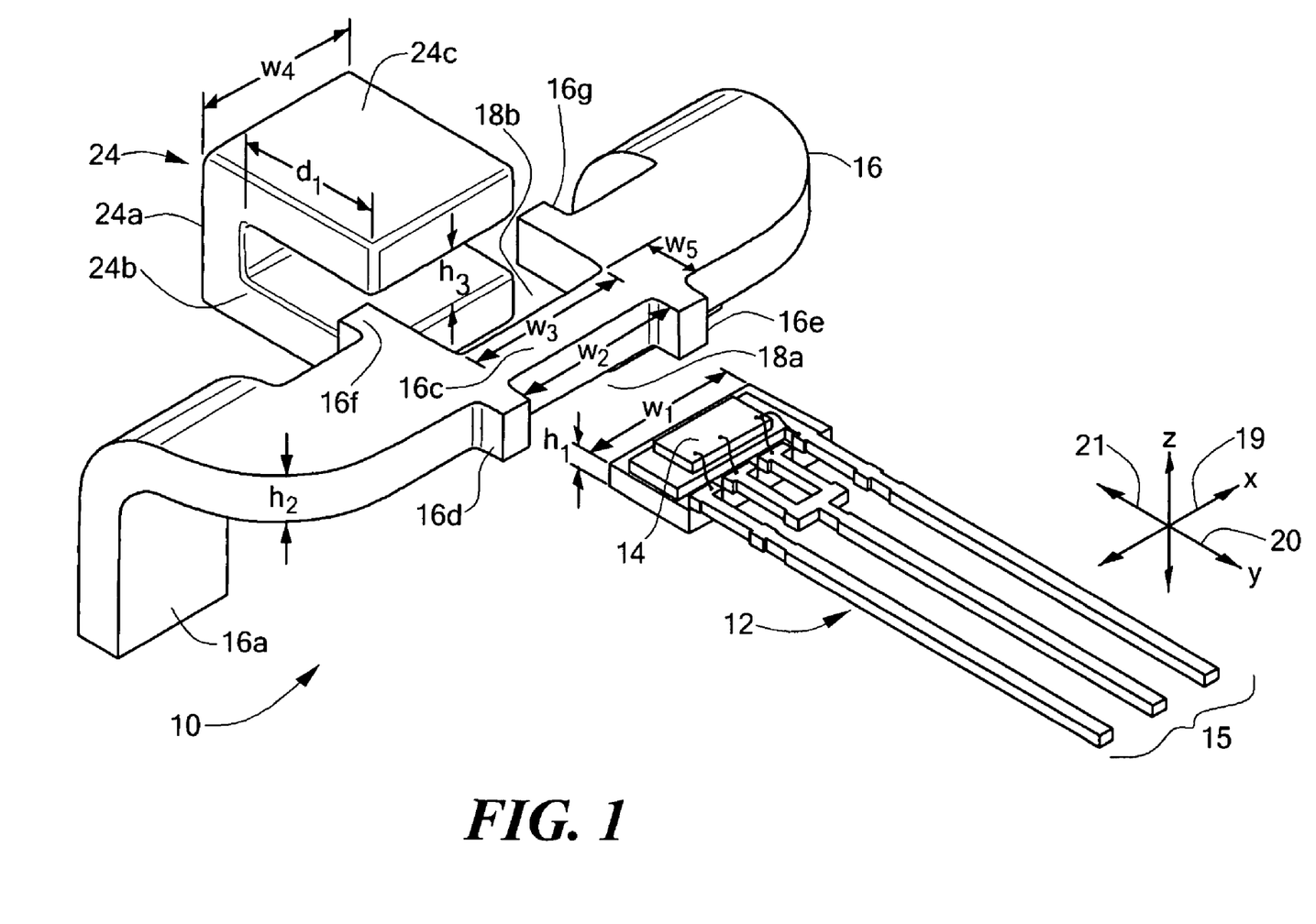
FIG. 1 is an exploded isometric view of a current sensor in accordance with the present invention.

Referring to FIG. 1, a miniaturized, integrated current sensor 10 includes a magnetic field transducer, here in the form of Hall effect sensor 12, a current-carrying conductor 16 and a magnetic core 24. The conductor 16 includes features for receiving portions of the Hall effect sensor 12 and the magnetic core 24 such that the elements are maintained in a fixed position relative to each other. In the illustrated embodiment, the conductor 16 has a first notch 18a and a second notch 18b substantially aligned with the first notch. In assembly, at least a portion of the Hall effect sensor 12 is disposed in the first notch 18a. The magnetic core 24 is substantially C-shaped and has a central region 24a and a pair of substantially parallel legs 24b, 24c extending from the central region. In assembly, at least a portion of the central region 24a is disposed in the second notch 18b of the conductor such that each leg 24b, 24c covers at least a portion of a respective surface of the Hall effect sensor 12.

The Hall effect sensor 12 is provided in the form of an integrated circuit containing a sensor die 14 encapsulated with an electrically insulating material. The integrated Hall effect sensor 12 can be provided in different package types, such as the "K" single in line (SIP) package having a thickness on the order of 1.6 mm. The effective air gap is equal to the thickness of the package, with the sensor die resting approximately in the center of the air gap.

The Hall effect sensor has leads 15 adapted for mounting to a printed circuit board (not shown). Leads 15, further described in association with FIG. 6, include a power, or Vcc, connection, a ground connection, and an output connection adapted to carry an output signal proportional to the current through the conductor 16. The output signal may be a current or a voltage.

The sensor die 14 includes a Hall effect element 14a (FIGS. 1B and 6) and Hall circuitry 14b (FIGS. 1B and 6) for processing the output signal of the Hall effect element. In the illustrative embodiment, the Hall circuitry 14b includes an amplifier, a filter, an output driver, and an offset cancellation circuit. Also provided in the Hall circuitry 14b is a trim control circuit for adjusting the sensitivity and quiescent operating voltage, as is shown and described below in association with FIG. 6. Such a Hall effect sensor 12 is available from Allegro Microsystems, Inc. of Worcester, Mass. under part number A3525. It will be appreciated by those ordinary skill in the art that other circuitry may be provided in the integrated Hall effect sensor 12. Use of the Hall effect sensor 12 enhances the integration of the current sensor 10 by incorporating circuit components which otherwise would be provided separately, such as by discrete components mounted to a printed circuit board.

Although a Hall effect sensor 12 is used in the current sensor 10 of FIG. 1, it will be appreciated by those of ordinary skill in the art that other types of magnetic field transducers, such as magnetic field transducers having an anisotropic magnetoresistance (AMR) element or a giant magnetoresistance (GMR) element, may alternatively be used.

The conductor 16 can be comprised of various conductive materials, such as copper, and is adapted for mounting to a printed circuit board through which the measured current is provided to the conductor 16. To this end, bent features or leads 16a, 16b (16b not shown) (also referred to herein as tabs) suitable for soldering into circuit board vias are provided at end portions of the conductor. Mechanisms other than bent tabs 16a, 16b may be used to mount the current sensor 10 to a circuit board, such as screw terminals and associated hardware or the flat features or leads 52a, 52b of FIGS. 2 and 2A (also referred to herein as tabs). In alternate embodiments, the same or other mounting mechanisms can be used to allow the current sensor 10 to be mounted to other than a circuit board. For example, the current sensor 10 can have wire couplings (not shown) that allow the current sensor 10 to be coupled in series with a wire.

Preferably, the conductor 16 (excluding the bent tabs 16a, 16b) is substantially planar as shown, without features extending in the z-axis 21 which would increase the height of the current sensor 10 off of the printed circuit board. In use, the plane of the conductor 16 is positioned close to the printed circuit board plane, thereby providing a low profile current sensor.

The first notch 18a of the conductor 16 has a width w2 selected to receive at least a portion of the Hall effect sensor 12, which has a width w1. Preferably, the width w1 and the width w2 are sufficiently similar so that, in assembly, the possible movement of the Hall effect sensor 12 relative to the conductor 16 in the x-axis 19 is negligible. More specifically, nominal width w1 is slightly smaller than nominal width w2, such as by approximately 0.28 mm, so that, with worst case tolerances, the largest width w1 is 0.4 mm smaller than the smallest width w2. In the illustrated embodiment, nominal width w1 is 5.18 mm and nominal width w2 is 5.46 mm. Widths w1 and w2 can thus be characterized as being substantially equal.

The second notch 18b of the conductor has a width w3 selected to receive at least a portion of the magnetic core 24. Preferably, the width w3 and the width w4 of the central region 24a of the magnetic core are sufficiently similar, so that, in assembly, the possible movement of the magnetic core 24 relative to the conductor 16 in the x-axis 19 is negligible. More specifically, nominal width w4 is slightly smaller than nominal width w3, such as by approximately 0.2 mm, so that, with worst case tolerances, the smallest width w4 is 0.34 mm smaller than the largest width w3 and the largest width w4 is 0.08 mm smaller than the smallest width w3. In the illustrated embodiment, nominal width w3 is 5.46 mm and nominal width w4 is 5.25 mm. Widths w3 and w4 can thus be characterized as being substantially equal.

The spacing h3 between magnetic core legs 24b, 24c, the thickness or height h2 of the conductor 16 and the thickness or height h1 of the Hall effect sensor 12 are all substantially similar so that possible movement of the components relative to each other in the z-axis 21 is restricted. More specifically, nominal conductor height h2 and sensor height h1 are slightly smaller than nominal height h3, such as by approximately 0.1 mm, so that, with worst case tolerances, the smallest height h1 and height h2 are 0.22 mm smaller than the largest height h3 and the largest height h1 and height h2 are 0.01 mm smaller than the smallest height h3. In the illustrated embodiment, the nominal height h1 is 1.55 mm, the nominal height h2 is 1.50 mm, and the nominal height h3 is 1.64 mm.

In other embodiments, however, the spacing h3 is selected in accordance with other factors. For example, in one alternate embodiment, the spacing h3 is substantially larger than the height h1 of the Hall effect sensor 12, in order to increase the reluctance and, therefore, to increase the current through the carrying conductor 16 that would saturate the current sensor 10. Thus, this alternate embodiment has a greater current carrying capacity.

The magnetic core 24 tailors the magnetic field across the sensor die 14 and may be referred to alternatively as a magnetic field concentrator. The magnetic core 24 may be comprised of various materials including, but not limited to ferrite, steel, iron compounds, and permalloy. The material of the magnetic core 24 is selected based on factors such as maximum measured current and the desired amount of magnetic shielding provided by the C-shaped magnetic core 24. Other factors include stability of the relative permeability over temperature and hysteresis (magnetic remanence). For example, a low hysteresis ensures greater accuracy for small currents through the conductor 16. The material and size of the magnetic core 24 are also selected in accordance with the desired full scale current through the conductor 16, wherein a magnetic core material with a higher saturation flux density (Bsat) allows the use of a smaller core for a given current flowing through the conductor 16. As will become apparent from consideration of FIG. 4 below, use of the magnetic core 24 significantly reduces the susceptibility of the current sensor 10 to stray magnetic fields.

The magnetic core 24 has a depth d1, selected so that each of the legs 24b, 24c substantially covers an entire respective surface of the sensor die 14. With this arrangement, a substantially uniform magnetic field is provided across the Hall effect element 14a (FIG. 1B) provided on the sensor die 14, thereby increasing device sensitivity and reducing susceptibility to stray magnetic fields.

Here, the conductor notch 18a is formed by features 16d, 16e extending radially outward from the conductor. Notch 18b is formed by a narrowed region 16c of the conductor in combination with features 16f, 16g extending from the conductor. The width w5 of the narrowed region 16c between the first and the second notches 18a, 18b is selected based on the maximum current carrying capability of the electrical conductor 16. Here, the width w5 is on the order 1.7 mm and the current carrying capability of the conductor 16 is on the order of 100 Amperes. Although the notches 18a, 18b could be formed by radial features 16d, 16e, and 16f, 16g respectively, without providing the narrowed conductor region 16c, the use of the narrowed region 16c minimizes the overall dimension of the current sensor 10 along the y-axis 20. The narrowed region also provides the current through the conductor 16 in closer proximity to the Hall effect sensor 12. In an alternate embodiment, the notches 18a, 18b are formed without the features 16d-16g, and are provided only by the narrowed region 16c.

Figure 1A:
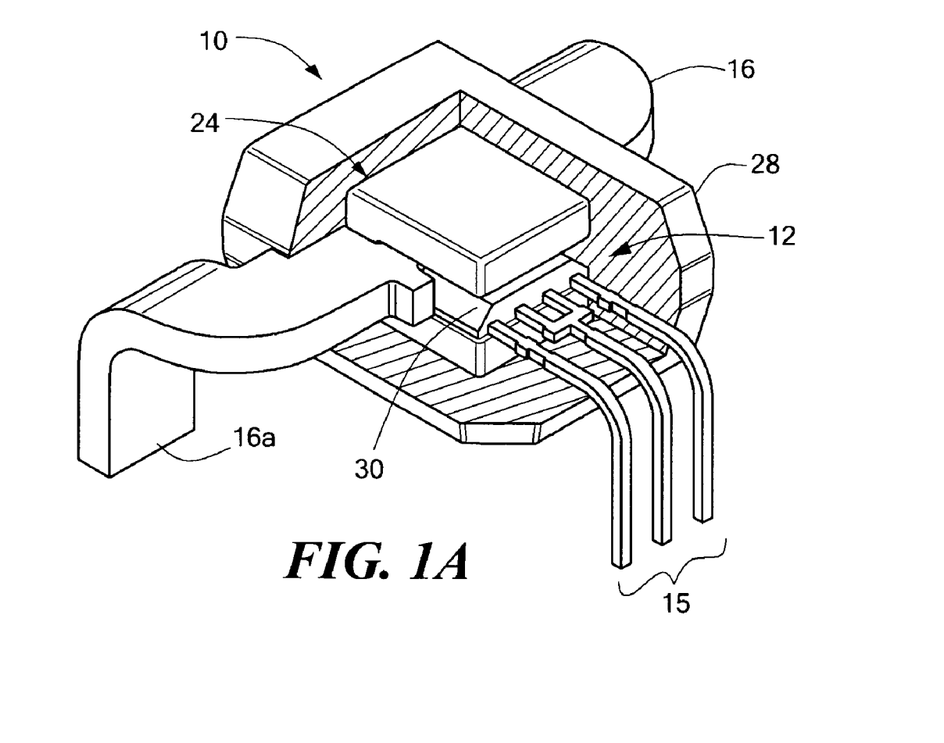
FIG. 1A is an isometric view of the assembled current sensor of FIG. 1.

Referring also to FIG. 1A, in which like elements are labeled with like reference designations, the assembled exemplary current sensor 10 is shown. As is apparent, a portion of the Hall effect sensor 12 is positioned in like-dimensioned conductor notch 18a (FIG. 1) and the central region 24a of the magnetic core 24 is positioned in like-dimensioned conductor notch 18b (FIG. 1). The leads 15 are bent to facilitate mounting of the current sensor 10 to a printed circuit board. Advantageously, the current sensor 10 is a low profile assembly, with the height of the current sensor off of the printed circuit board determined by the thickness of the molded body 28.

The molded body 28 comprising an electrically insulating material is disposed over the magnetic core 24, a portion of the conductor 16, and the Hall effect sensor 12, as shown. The molded body 28 further reduces movement of the elements relative to each other by additionally preventing movement in the direction of the x-axis 19, y-axis 20, and z-axis 21.

With this arrangement, the magnetic core 24, the conductor 16, and the Hall effect sensor 12 are fixed in place relative to each other. The result of this mechanical "interlock" is highly repeatable and tightly controlled current sensor performance.

Figure 1B:
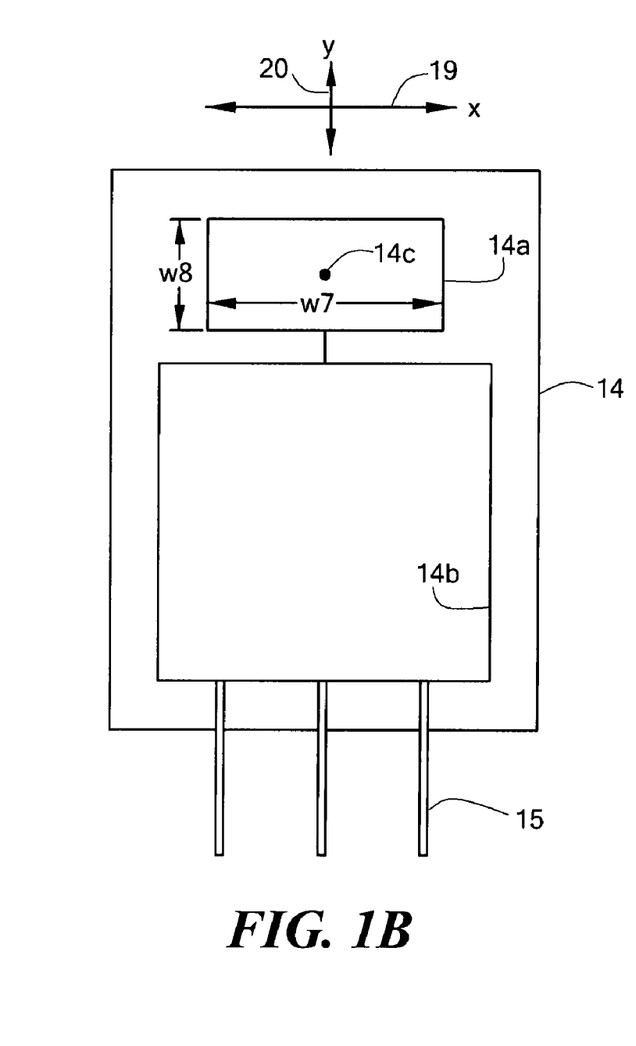
FIG. 1B is a plan view of a sensor die of the Hall effect sensor of FIG. 1A.

Referring now to FIG. 1B, in which like elements of FIGS. 1 and 1A are labeled with like reference designations, the sensor die 14 is shown to include the Hall effect element 14a having a width w7 along the x-axis 19, a width w8 along the y-axis 20, and center labeled 14c. The sensor die 14 also includes circuitry 14b, here shown as a representative block coupled to the Hall effect element 14a. The Hall effect element 14a and the circuitry 14b are shown in greater detail in FIG. 6.

The Hall effect element 14a and the circuitry 14b are formed on a single die, which is encapsulated and provided in the form of a single integrated circuit Hall effect sensor 12. In an alternate embodiment, the Hall effect element 14a and the associated circuitry 14b can be formed as separate integrated circuits coupled with wire bonds or the like. In Hall circuitry 14b is electrically coupled to the leads 15 (FIGS. 1, 1A) of the Hall effect sensor 12.

Figure 2:
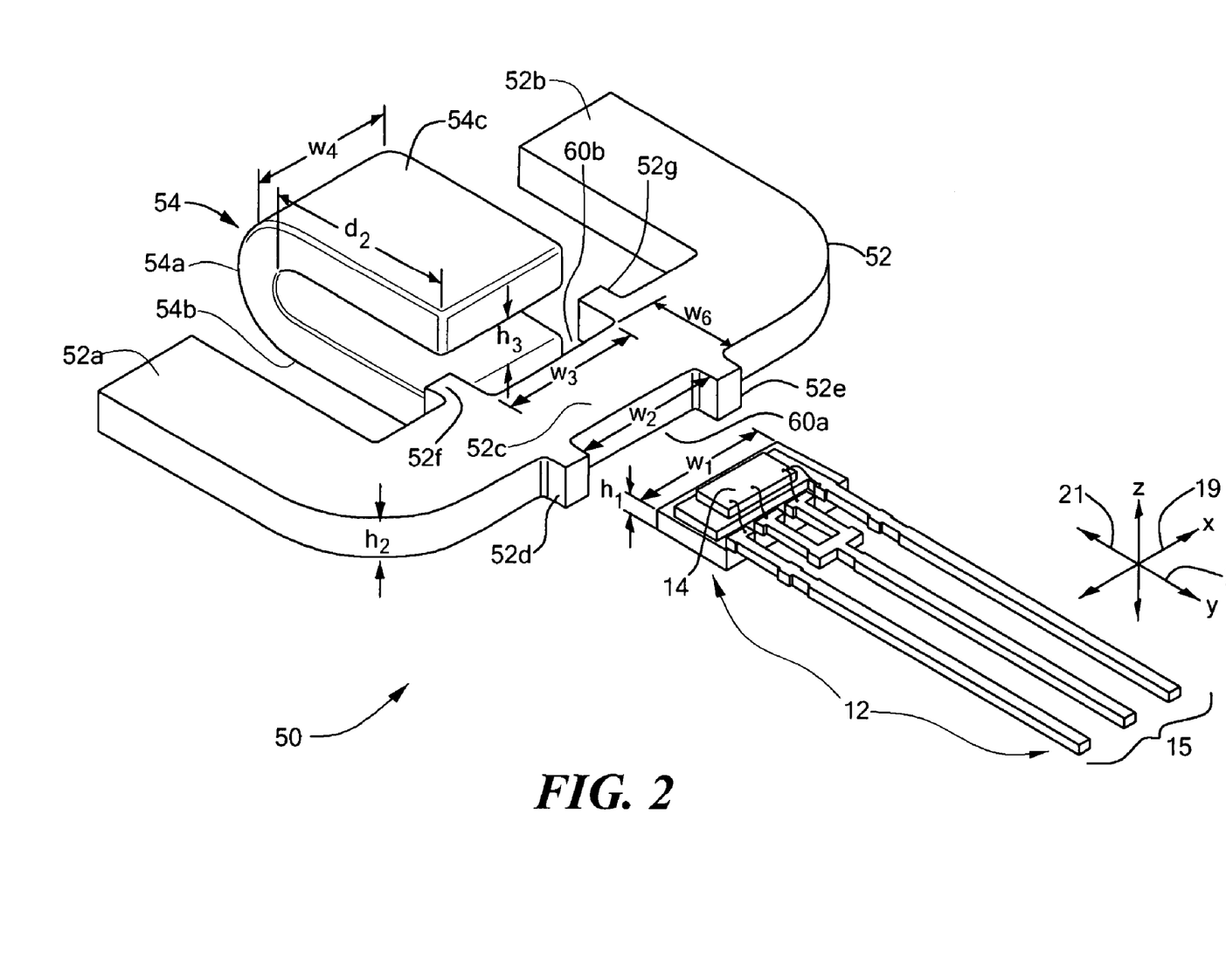
FIG. 2 is an exploded isometric view of an alternative current sensor in accordance with the present invention.
Figure 2A:
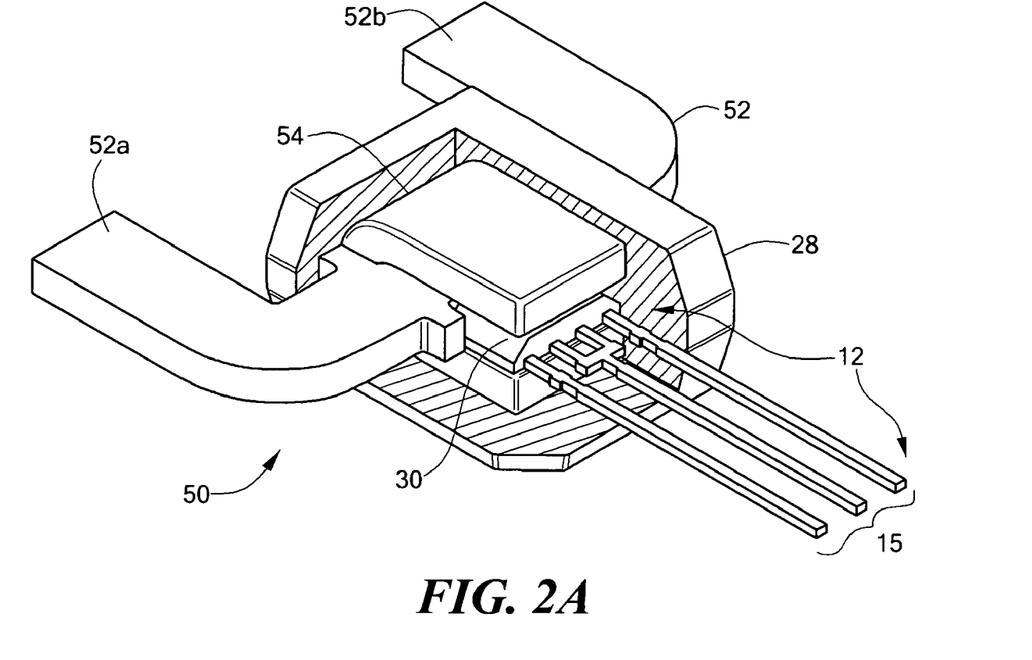
FIG. 2A is an isometric view of the assembled current sensor of FIG. 2.

Referring to FIGS. 2 and 2A, in which like elements of FIGS. 1 and 1A are labeled with like reference designations, an alternative exemplary current sensor 50 includes the Hall effect sensor 12, a conductor 52, and a magnetic core 54. The conductor 52, like conductor 16 of FIGS. 1 and 1A, has a first notch 60a and a second notch 60b substantially aligned with the first notch. The first notch 60a has a width w2, which is sufficiently similar to the width w1 of the Hall effect sensor 12 so as to restrict the relative movement of the elements in the x-axis 19 and the second notch 60b has width w3, which is sufficiently similar to the width w4 of the magnetic core 54 so as to restrict the relative movement of the elements in the x-axis.

The magnetic core 54 has a central region 54a of width w4 and a pair of substantially parallel legs 54b, 54c extending from the central region and separated by a height h3. The depth d2 of the magnetic core 54 is selected so that each of the legs 54b, 54c covers substantially an entire respective surface of the sensor die 14.

The height h1 of the Hall effect sensor 12, the height h2 of the conductor 52, and the separation h3 of the parallel legs 54b, 54c are sufficiently similar, so that, in assembly, the legs 54b, 54c prevent relative movement of the elements along the z-axis 21. The widths w1, w2, w3, w4, and heights h1, h2, and h3 are substantially identical to like dimensions in the current sensor 10 of FIG. 1.

In assembly, as shown in FIG. 2A, a portion of the Hall effect sensor 12 is disposed in the first notch 60a and a portion of the magnetic core 54 is disposed in the second notch 60b, as shown. With this arrangement, the magnetic core 54, the conductor 52, and the Hall effect sensor 12 are prevented from moving relative to each other along the x-axis 19 and z-axis 21. Molded body 28 is provided over the magnetic core 54, portions of the conductor 52, and the Hall effect sensor 12 to further reduce movement of the elements relative to each other along the x-axis 19, y-axis 20, and z-axis 21.

The current sensor 50 differs from current sensor 10 of FIGS. 1 and 1A generally in features of the conductor 52 and the magnetic core 54. In particular, the conductor 52 has flat leads or tabs 52a, 52b which serve as the mounting mechanism for mounting the conductor 52 to a circuit board (not shown). In use, a hole or depression is provided in the printed circuit board. The molded body 28 is positioned in the hole or depression such that the tabs 52a and 52b rest flat on the surface of the printed circuit board over plated pads to which they are soldered by conventional surface mount techniques.

The electrical conductor 52 has a narrowed region 52c separating the first and the second notches 60a, 60b. Here, notch 60a is formed by features 52d, 52e extending radially outward from the conductor and notch 60b is formed by a combination of radial features 52f, 52g and narrowed region 52c. The narrowed region 52c has a width w6, which is greater than the width w5 of the narrowed region 16c (FIGS. 1 and 1A). Thus, notch 60b is not as deep as notch 18b (FIGS. 1 and 1A). Accordingly, the electrical resistance of the narrowed region 52c is less than the resistance of the narrowed region 16c of FIG. 1. Thus, less power is dissipated per ampere flowing through the narrowed regions 52c. Since the width w6 of the narrowed region 52c is associated with the maximum current carrying capability of the sensor 50, the conductor 52 is adapted to carry more current than the conductor 16 of FIG. 1. In the illustrative embodiment, the width w6 is 3 mm and the maximum current carrying capacity of the conductor 52 is 200 Amperes. In an alternate embodiment, the notches 60a, 60b are formed without the features 52d-52g, and are provided only by the narrowed region 52c.

Magnetic core 54 differs from magnetic core 24 of FIGS. 1 and 1A in that the central region 54a is curved relative to the parallel legs 54b, 54c. The shape of the magnetic core 54, here a C-shape is selected in accordance with a variety of factors, including, but not limited to the material of the magnetic core 54. The factors used to select the material of the core 54 are the same as those described above for the magnetic core 24 of FIG. 1. In one illustrative embodiment, the core 54 is comprised of a silicon steel alloy which has a higher saturation flux density than ferrite. Also, the depth d2 is greater than the depth d1 of the exemplary embodiment of FIG. 1, adapted to the width w6 that is greater than the width w5 in the embodiment of FIG. 1.

Figure 3:
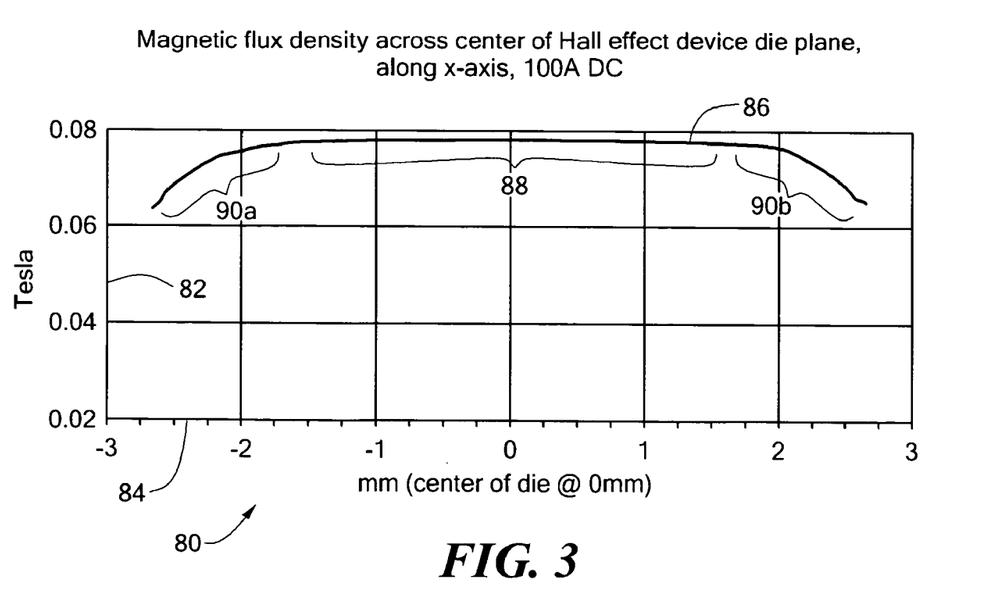
FIG. 3 is a graph of the magnetic field at a Hall effect element contained in the current sensor of FIGS. 1 and 2 as measured in the x-axis of the Hall effect element plane.

Referring to FIG. 3, a graph 80 illustrates the magnetic flux density along the x-axis 19 of the sensor die 14 when 100A is passed through the conductor 52 of the exemplary current sensor 50 of FIGS. 2 and 2A. The center 14c of the Hall effect element 14a within the sensor die 14 (FIG. 1B) corresponds to zero millimeters on the abscissa 84.

The magnetic flux curve 86 can be characterized as having a central portion 88 that is essentially flat and inclined end portions 90a, 90b. Consideration of curve 86 reveals that the magnetic flux is substantially constant in the central portion 88, for a span on the order of 4 mm, centered about the element center 14c of the Hall effect element 14a. Portions of the Hall effect element 14a located more than 2 mm from the Hall effect element center 14c along the x-axis 19 experience reduced magnetic flux density. The illustrative Hall effect element 14a has an x-axis width w7 on the order of 0.2 mm, centered on the sensor die 14 typically having dimensions of approximately 1.6 mm by 3 mm, and therefore the entire Hall effect element 14a lies in the central portion 88. The width of central portion 88 is substantially greater than the width w7 (FIG. 1B) of the Hall effect element 14a, and the Hall effect element 14a is sufficiently centered within the central portion 88 to ensure that the Hall effect element 14a is within the greatest amount of magnetic field.

It will be appreciated by those of ordinary skill in the art that the dimensions of the magnetic core 54 relative to the Hall effect element 14a significantly affect the uniformity of the flux density across the Hall effect element 14a in the x-axis 19. In particular, the wider the magnetic core 54 (i.e., the greater the width w4), relative to the width w7 of the Hall effect element 14a, the longer the central portion 88 of the curve 86, whereas, the narrower the magnetic core, the shorter the central portion 88.

Curve 86 presumes that the magnetic core 54 and Hall effect element 14a are centered relative to one another in the x-axis 19, as is ensured by their fixed placement relative to aligned conductor notches 60a, 60b. Movement of the Hall effect element 14a relative to the magnetic core 54 along the x-axis 19 would result in the curve 86 moving along the abscissa 84 and thus, result in areas of the Hall effect element 14a even closer to its center 14c than 2 mm, experiencing significantly reduced flux density. This effect highlights the desirability of restricting relative movement of the Hall effect sensor 12 and the magnetic core 54. Further, since there is a tolerance associated with the location of the sensor die 14 and associated Hall effect element 14a (FIG. 1B) within the Hall effect sensor 12, fixing the position of the Hall effect sensor 12 relative to the magnetic core 54 is critical.

Figure 3A:
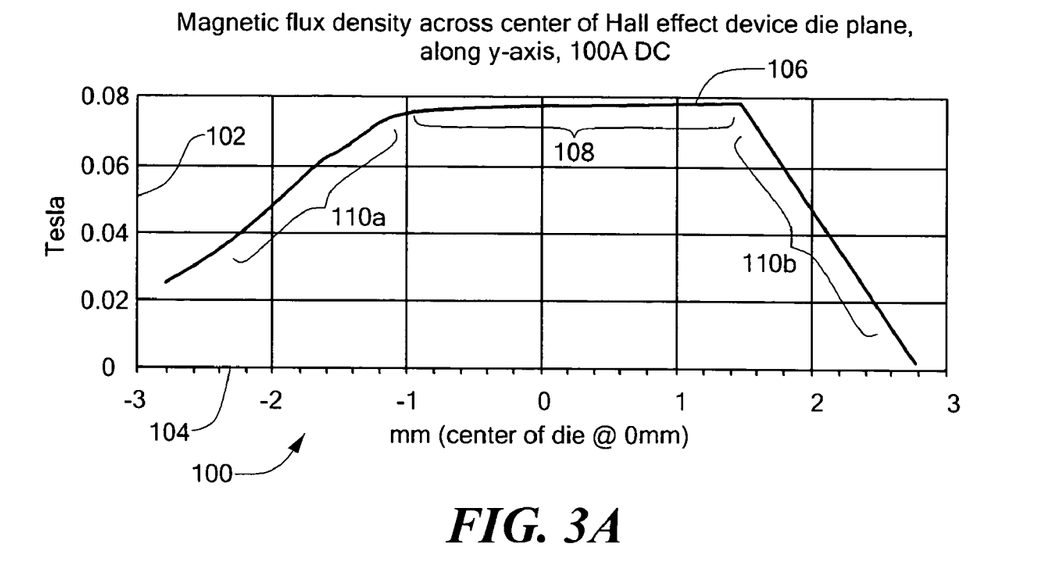
FIG. 3A is a graph of the magnetic field at the Hall effect element contained in the current sensor of FIGS. 1 and 2 as measured in the y-axis of the Hall effect element plane.

Referring also to FIG. 3A, a graph 100 illustrates the magnetic flux density along the y-axis 20 of the sensor die 14 when 100A is passed through the conductor of the exemplary current sensor 50 of FIGS. 2 and 2A. The center 14c of the Hall effect element 14a corresponds to zero millimeters on the abscissa 84.

The magnetic flux curve 106 can be characterized as having a central portion 108 that is essentially flat and inclined end portions 110a, 110b. Consideration of curve 106 reveals that the magnetic flux is substantially constant in the central portion 108, for a span on the order of 2.5 mm, centered about the center 14c of the Hall effect element 14a. Portions of the Hall effect element 14a located more than 1.25 mm from the Hall effect element center 14c along the y-axis experience reduced magnetic flux density. The illustrative Hall effect element 14a has a y-axis width w8 on the order of 0.2 mm, centered on the sensor die 14 typically having dimensions of approximately 1.6 mm by 3 mm, and therefore the entire Hall effect element 14a lies in the central portion 108. The width of central portion 108 is substantially greater than the width w8 (FIG. 1B) of the Hall effect element 14a, and the Hall effect element 14a is sufficiently centered within the central portion 108 to ensure that the Hall effect element 14a is within the greatest amount of magnetic field.

It will be appreciated by those of ordinary skill in the art that the dimensions of the magnetic core 54 relative to the Hall effect element 14a significantly affect the uniformity of the flux density across the Hall effect element 14a in the y-axis 20. In particular, the deeper the magnetic core 54 (i.e., the greater the depths d2, FIG. 2), relative to the width w8 of the Hall effect element 14a, the longer the central portion 108 of the curve 106, whereas, the shallower the magnetic core, the shorter the central portion 108.

Curve 106 presumes that the magnetic core 54 and Hall effect element 14a are centered relative to one another in the y-axis 20, as is ensured by their fixed placement relative to aligned conductor notches 60a, 60b. Movement of the Hall effect element 14a relative to the magnetic core 54 along the y-axis 20 would result in the curve 106 moving along the abscissa 104 and thus, result in areas of the Hall effect element 14a, even closer to its center 14c than 1.25 mm, experiencing significantly reduced flux density. This effect again highlights the desirability of restricting relative movement of the Hall effect sensor 12 and the magnetic core 54.

Figure 4:
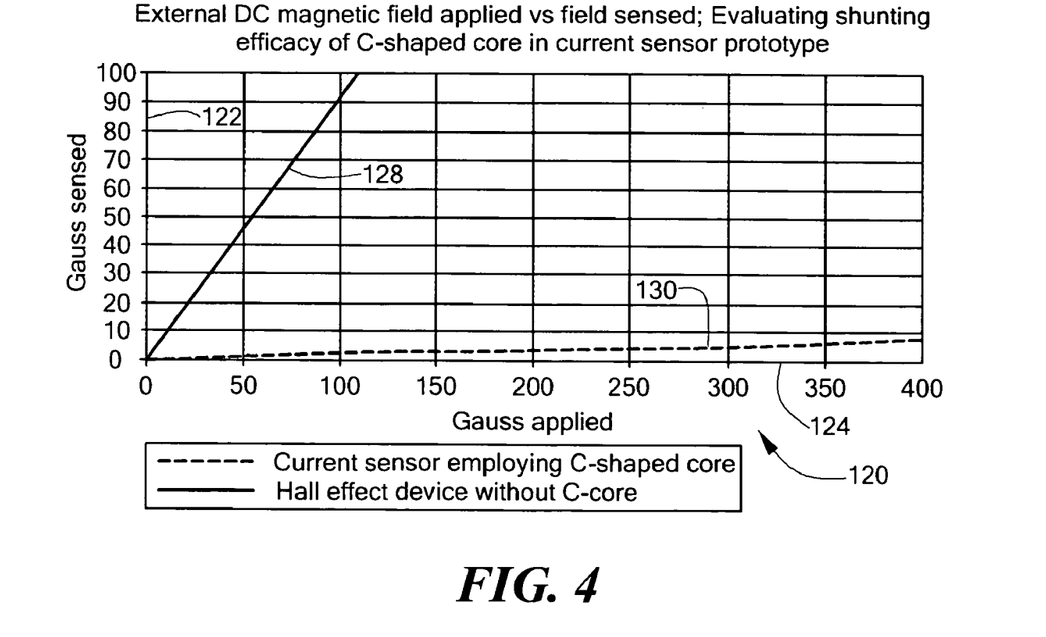
FIG. 4 is a graph showing the magnetic field sensed by the Hall effect sensor of FIG. 2 with and without the magnetic core.

Referring to FIG. 4, a graph 120 illustrates the significance of the magnetic core 24 (FIGS. 1, 1A) in reducing the effect of stray, or external, magnetic fields. The abscissa 124 represents an external magnetic field applied along the z-axis 21 (FIG. 1) to the current sensor 10 of FIG. 1A (as contrasted to the magnetic field generated by a current passing through the conductor 16) and the ordinate 122 represents the magnetic field sensed by the current sensor 10. Curve 128 corresponds to a current sensor of the type shown in FIGS. 1 and 1A, but without the C-shaped magnetic core 24 and curve 130 corresponds to the current sensor 10 having the magnetic core 24. Curve 128 shows that the magnetic field sensed by the Hall effect sensor 12 is substantially the same as the externally applied field; whereas, curve 130 shows that, with the magnetic core 24, the magnetic field sensed by the current sensor 10 is significantly less than the externally applied field.

Figure 5:
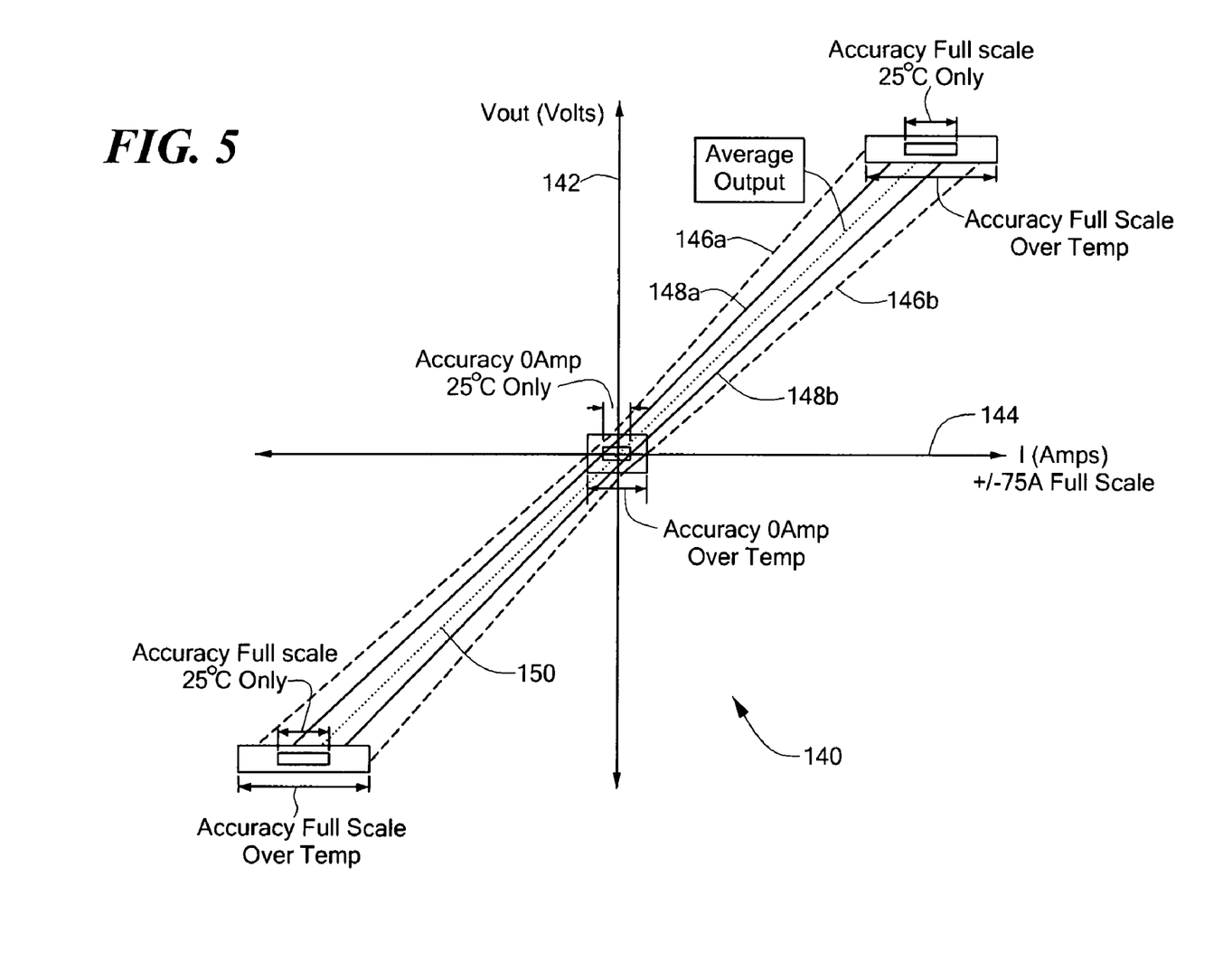
FIG. 5 is a graph showing the accuracy of the current sensor of FIG. 2.

Referring to FIG. 5, a graph 140 illustrates the accuracy performance of the current sensor 10 of FIGS. 1 and 1A. The accuracy represents the maximum deviation of the actual sensor output from its ideal value. The current through the conductor 16 is shown on the abscissa 144 and the voltage of the current sensor output signal is shown on the ordinate 142.

The ideal relationship between current through the conductor and output voltage is illustrated by curve 150, here a straight line. Curves 146*a* and 146*b* represent the accuracy bounds of sensing current flow over a range of temperatures. More particularly, curves 146*a* and 146*b* represent the accuracy bounds of sensing current flow throughout the temperature range of −40° C. to +85° C. Curves 148*a* and 148*b* represent the accuracy bounds of sensing current flow at a fixed temperature of 25° C.

Figure 6:
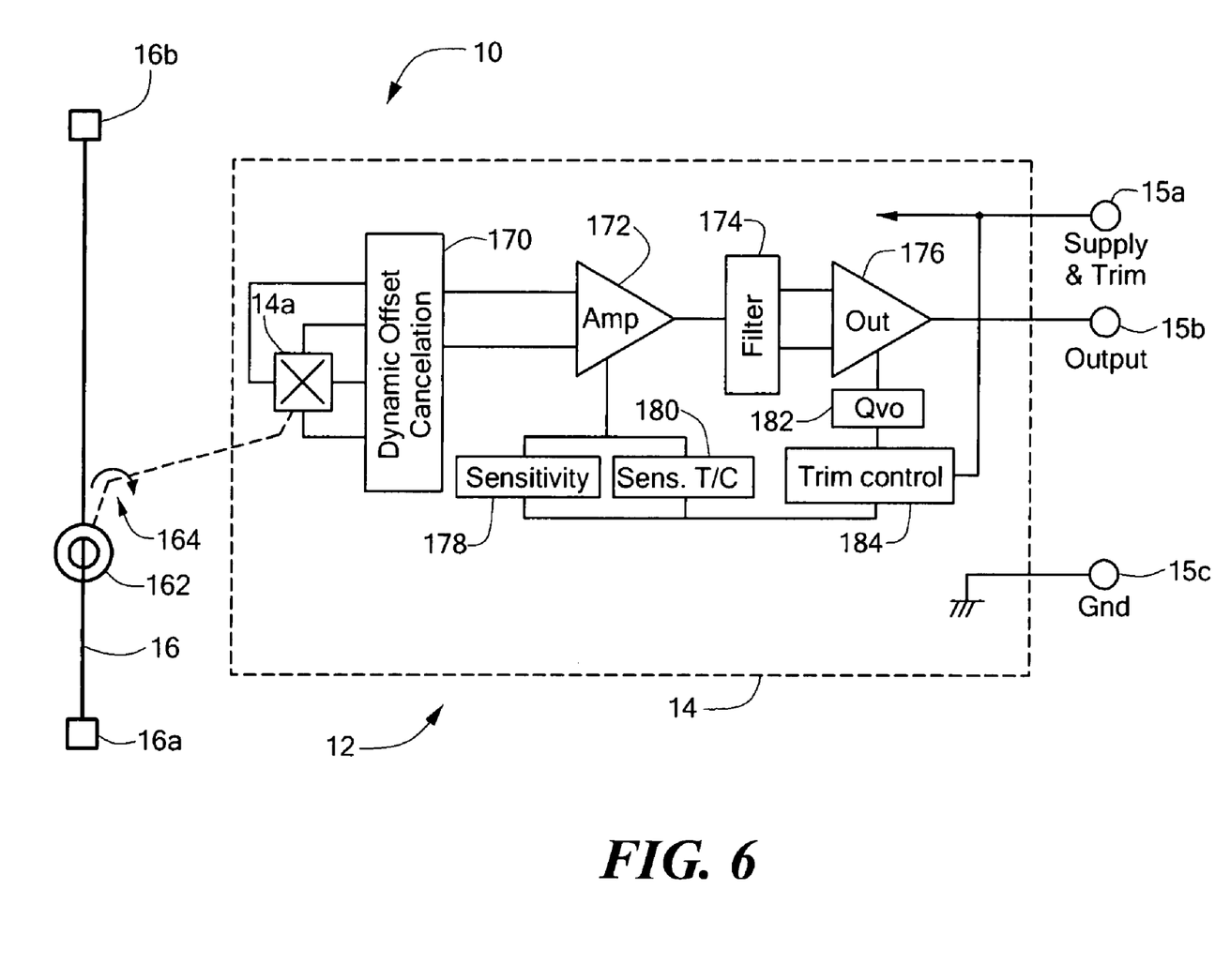
FIG. 6 is a block diagram of the current sensor of FIG. 1.

Referring to FIG. 6, a schematic representation of the exemplary Hall effect current sensor 10 of FIGS. 1, 1A, and 1B includes the conductor 16 represented by a line having circuit board mounting mechanisms 16*a*, 16*b*, and the magnetic core 24 here represented by a toroid 162. The illustrative Hall effect sensor 12 includes the sensor die 14 and leads 15, here labeled 15*a*, 15*b*, and 15*c*. Lead 15*a* provides a power connection to the Hall effect current sensor 12, lead 15*b* provides a connection to the current sensor output signal, and lead 15*c* provides a reference, or ground connection to the current sensor.

The Hall effect element 14*a* senses a magnetic field 164 induced by a current flowing in the conductor 16, producing a voltage in proportion to the magnetic field 164. The Hall effect element 14*a* is coupled to a dynamic offset cancellation circuit 170, which provides a DC offset adjustment for DC voltage errors associated with the Hall effect element 14*a*. When the current through the conductor 16 is zero, the output of the dynamic offset cancellation circuit 170 is adjusted to be zero.

The dynamic offset cancellation circuit 170 is coupled to an amplifier 172 that amplifies the offset adjusted Hall output signal. The amplifier 172 is coupled to a filter 174 that can be a low pass filter, a high pass filter, a band pass filter, and/or a notch filter. The filter is selected in accordance with a variety of factors including, but not limited to, desired response time, the frequency spectrum of the noise associated with the Hall effect element 14*a*, the dynamic offset cancellation circuit 170, and the amplifier 172. In one particular embodiment, the filter 174 is a low pass filter. The filter 174 is coupled to an output driver 176 that provides an enhanced power output for transmission to other electronics (not shown).

A trim control circuit 184 is coupled to lead 15*a* through which power is provided during operation. Lead 15*a* also permits various current sensor parameters to be trimmed, typically during manufacture. To this end, the trim control circuit 184 includes one or more counters enabled by an appropriate signal applied to the lead 15*a*.

The trim control circuit 184 is coupled to a quiescent output voltage (Qvo) circuit 182.

The quiescent output voltage is the voltage at output lead 15*b* when the current through conductor 16 is zero. Nominally, for a unipolar supply voltage, Qvo is equal to Vcc/2. Qvo can be trimmed by applying a suitable trim signal through the lead 15*a* to a first trim control circuit counter within the trim control circuit 184 which, in turn, controls a digital-to-analog converter (DAC) within the Qvo circuit 182.

The trim control circuit 184 is further coupled to a sensitivity adjustment circuit 178. The sensitivity adjustment circuit 178 permits adjustment of the gain of the amplifier 172 in order to adjust the sensitivity of the current sensor 10. The sensitivity can be trimmed by applying a suitable trim signal through the lead 15*a* to a second trim control circuit counter within the trim control circuit 184 which, in turn, controls a DAC within the sensitivity adjustment circuit 178.

The trim control circuit 184 is further coupled to a sensitivity temperature compensation circuit 180. The sensitivity temperature compensation circuit 180 permits adjustment of the gain of the amplifier 172 in order to compensate for gain variations due to temperature. The sensitivity temperature compensation can be trimmed by applying a suitable trim signal through the lead 15*a* to a third trim control circuit counter within the trim control circuit 184 which, in turn, controls a DAC within the sensitivity temperature compensation circuit 180.

It will be appreciated by those of ordinary skill in the art that the circuitry shown in FIG. 6 is illustrative only of exemplary circuitry that may be associated with and integrated into a Hall effect current sensor, like the Hall effect current sensor 10 of FIG. 1. In another embodiment, additional circuitry may be provided for converting the current sensor into a "digital fuse" which provides a high or low output signal depending on whether the magnetic field 164 induced by the current through the conductor 16 is greater or less than a predetermined threshold level. The additional circuitry for this alternative embodiment can include a comparator and/or a latch, and/or a relay. An exemplary embodiment of a digital fuse is shown in FIG. 7.

Further, since the conductor connections 16*a*, 16*b* are electrically isolated from the current sensor leads 15*a*, 15*b*, and 15*c*, the current sensor 10 can be used in applications requiring electrical isolation without the use of opto-isolators or other isolating techniques, such as transformers.

Figure 7:
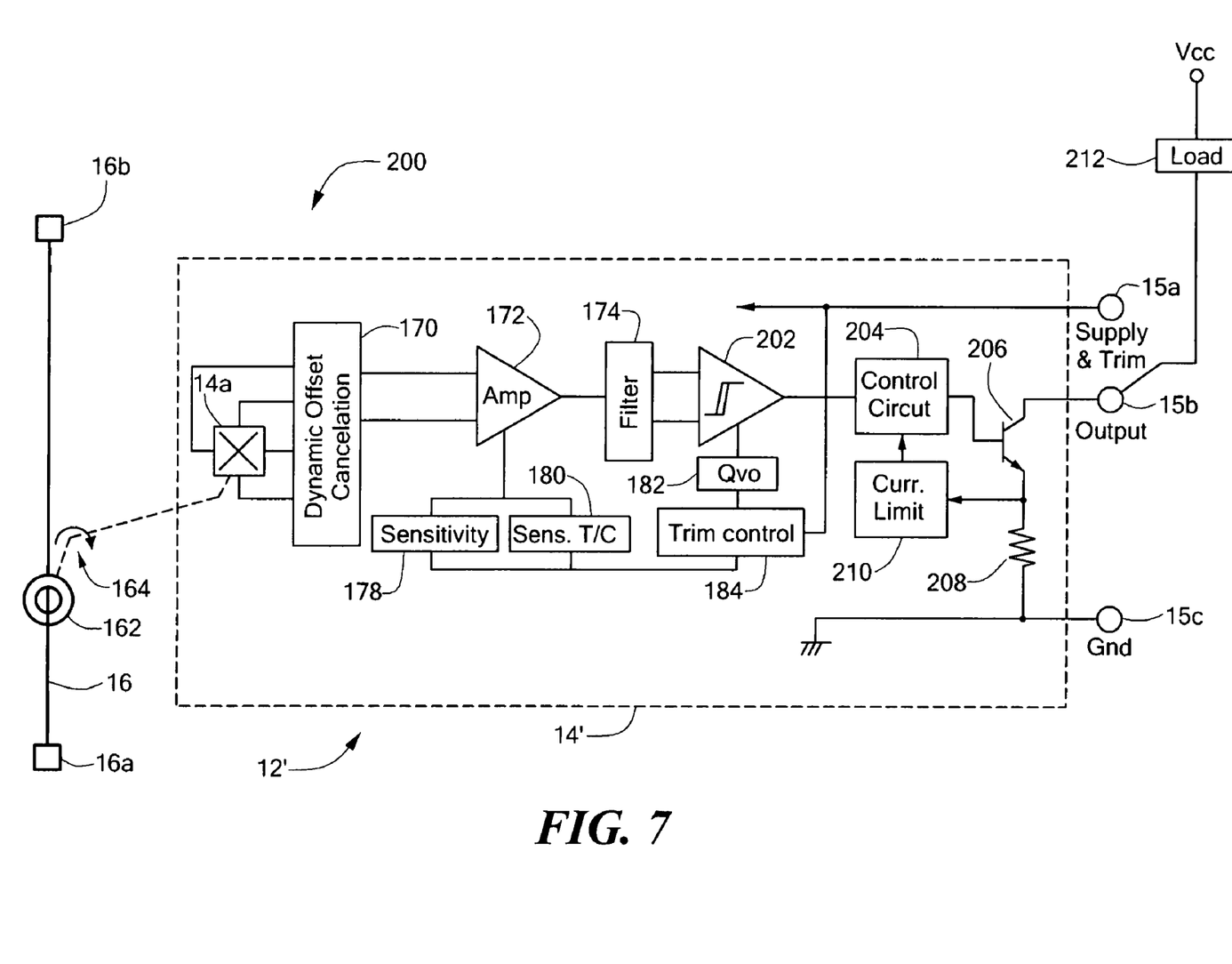
FIG. 7 is a block diagram of an exemplary digital fuse circuit that can be provided in the same form as the current sensor of FIG. 1, including the core and conductor of FIG. 1 but including an alternative Hall effect sensor as shown.

Referring now to FIG. 7, in which like elements of FIG. 6 are shown having like reference designations, an exemplary digital fuse circuit 200 includes conductor 16, core 162 and a Hall effect sensor 12' including a sensor die 14'. The die 14' includes a Schmitt trigger 202 coupled to the filter 174. The Schmitt trigger provides an output signal in a first digital state when the magnetic field 164 is below a first threshold value and a second digital state when the magnetic field 164 is above a second threshold value. The first digital state corresponds to a low current through the conductor 16. The second digital state corresponds to a higher current through the conductor 16. The Schmitt trigger output signal is provided to a control circuit 204 that provides a control signal to a transistor 206. The control signal causes transistor 206 to conduct when the Schmitt trigger output signal is in one of the two digital states and causes transistor 206 to be off when the Schmitt trigger output signal is in the other one of the two digital states. A resistor 208 in combination with a current limit circuit 210 limits the current through the transistor 206.

The output lead 15b (FIG. 1) can be coupled to a load 212, not part of the digital fuse circuit 200, and the load 212 therefore receives electrical current from a power supply Vcc in response to the on or off condition of the transistor 206. For example, in one embodiment, the load 212 receives full current when the magnetic field 164 is below the first threshold, corresponding to a low current through the conductor 16, and the load 212 receives zero current when the magnetic field 164 is above the second threshold value, corresponding to a higher current through the conductor. It will be appreciated by those of ordinary skill in the art that a flip-flop or latch may be included in order to allow the state of the transistor 206 to be latched to either the on or the off condition.

Figure 8:
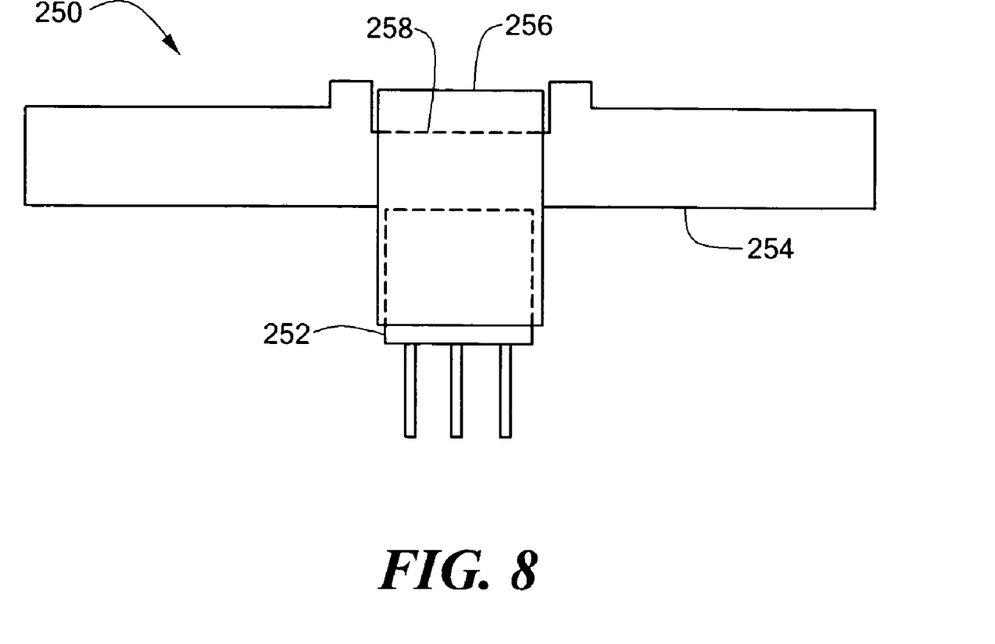
FIG. 8 is a plan view showing an alternate arrangement of the current sensor in accordance with the present invention.

Referring now to FIG. 8, an integrated current sensor 250 includes a magnetic field transducer, here in the form of Hall effect sensor 252, a current-carrying conductor 254, and a magnetic core 256. The magnetic core 256 is the type of magnetic core 24 shown in FIG. 1 and the Hall effect sensor 252 is the type of sensor 12 shown in FIG. 1. In this embodiment, the current-carrying conductor 254 has only one notch 258. The notch 258 is comparable to the notch 18b of FIG. 1, providing the same capabilities and advantages. Thus, the notch 258 is adapted to receive a portion of the like-dimensioned magnetic core 256, aligning the magnetic core in essentially the same way as described in conjunction with FIG. 1.

A molded body (not shown), similar to the molded body 28 of FIG. 1A, can be provided to further reduce movement of the elements relative to each other. The conductor 254 is substantially planar, without features extending in the z-axis. In use, the conductor is positioned close to the surface of the printed circuit board, thereby avoiding additional height off of the printer circuit board.

While the current sensor 250 is shown having the one notch 258 in association with the magnetic core 256, in another embodiment, an alternate current sensor has only one notch, comparable to the notch 18a of FIG. 1, adapted to receive the like-dimensioned Hall effect sensor (e.g., Hall effect sensor 152).

Figure 8A:
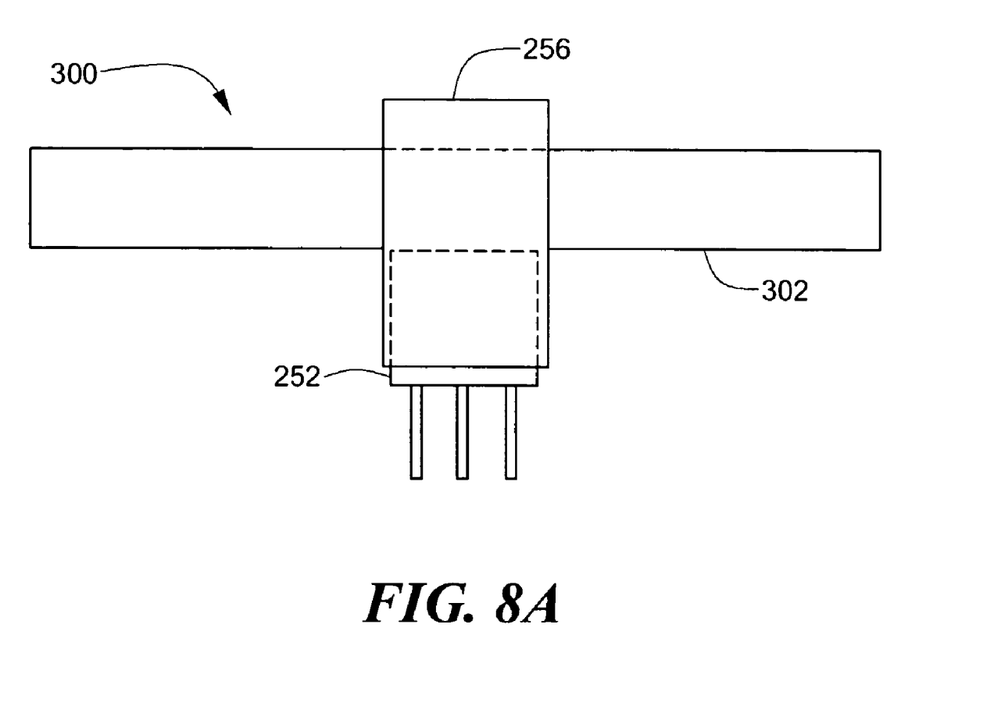
FIG. 8A is a plan view showing another alternate arrangement of the current sensor in accordance with the present invention.

Referring now to FIG. 8A, in which like elements of FIG. 8 are shown having like reference designations, an integrated current sensor 300 includes a magnetic field transducer, here in the form of the Hall effect sensor 252, a current-carrying conductor 302, and the magnetic core 256. In this embodiment, the current-carrying conductor 302 has no notches comparable to the notches 18a, 18b of FIG. 1 for receiving a portion of the sensor 254 and/or core 256. Rather, the Hall effect sensor 252 is juxtaposed with respect to an edge of the conductor 302 as shown and the magnetic core is positioned to straddle the opposite edge of the conductor 302 so that each of the legs of the core covers a substantial portion of a respective surface of the Hall effect sensor. Here again, the conductor 302 is substantially planar.

A molded body (not shown), similar to the molded body 28 of FIG. 1A, can be provided to further reduce movement of the elements relative to each other. Thus, this particular embodiment can rely upon a molded body to keep the elements in a substantially fixed relative position.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are hereby incorporated herein by reference in their entirety.

What is claimed is:

1. A current sensor comprising:
   a conductor having a narrowed region, a tab, and an intermediate region extending from the narrowed region to the tab, wherein the narrowed region has opposing, substantially planar surfaces, wherein the intermediate region has opposing, substantially planar surfaces, wherein the opposing, substantially planar surfaces of the intermediate region are generally parallel to the opposing, substantially planar surfaces of the narrowed region, wherein the narrowed region comprises a notch in a first side of the narrowed region, wherein the tab is adapted to couple to a circuit board with the opposing, substantially planar surfaces of the narrowed region substantially parallel to the circuit board;
   a magnetic field transducer; and
   a magnetic core having a central region and a pair of substantially parallel legs extending from said central region, wherein a selected one of said magnetic field transducer or said central region of the magnetic core is disposed in the notch and wherein the other one of the magnetic field transducer or the central region of the magnetic core is adjacent to a second, opposite, side of the narrowed region so that said pair of legs straddles the opposing, substantially planar surfaces of the narrowed region with each leg covering at least a portion of a respective surface of the magnetic field transducer.

2. The current sensor of claim 1, further comprising a molded body encapsulating at least a portion of said magnetic field transducer, said conductor, and said magnetic core.

3. The current sensor of claim 1, wherein the magnetic field sensor comprises at least one Hall effect element.

4. The current sensor of claim 1, wherein the magnetic field sensor comprises at least one magnetoresistance element.

5. The current sensor of claim 1, wherein the tab is adapted to be inserted though a hole in the circuit board.

6. The current sensor of claim 1, wherein the tab comprises a plastically bent portion of the conductor.

* * * * *

UNITED STATES PATENT AND TRADEMARK OFFICE
CERTIFICATE OF CORRECTION

PATENT NO. : 7,265,531 B2
APPLICATION NO. : 10/831906
DATED : September 4, 2007
INVENTOR(S) : Stauth et al.

It is certified that error appears in the above-identified patent and that said Letters Patent is hereby corrected as shown below:

Col. 3, line 52, delete "those ordinary" and replace with --those of ordinary--.

Col. 5, line 37-38, delete "order 1.7mm" and replace with --order of 1.7 mm--.

Col. 6, line 19-20, delete "In Hall circuitry 14b is electrically" and replace with --The Hall circuitry 14b--.

Col. 7, line 15, delete "regions 52c." and replace with --region 52c--.

Col. 8, line 35, delete "y-axis" and replace with --y-axis 20--.

Col. 12, line 53, delete "though" and replace with --through--.

Signed and Sealed this

Seventh Day of October, 2008

JON W. DUDAS
*Director of the United States Patent and Trademark Office*